US010872648B2

(12) United States Patent
Ingalls

(10) Patent No.: US 10,872,648 B2
(45) Date of Patent: Dec. 22, 2020

(54) APPARATUSES AND METHODS FOR REDUCING ROW ADDRESS TO COLUMN ADDRESS DELAY

(71) Applicant: MICRON TECHNOLOGY, INC., Boise, ID (US)

(72) Inventor: Charles L. Ingalls, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/740,114

(22) Filed: Jan. 10, 2020

(65) Prior Publication Data

US 2020/0152250 A1 May 14, 2020

Related U.S. Application Data

(63) Continuation of application No. 16/038,063, filed on Jul. 17, 2018, now Pat. No. 10,535,388.

(51) Int. Cl.

| | |
|---|---|
| ***G11C 5/06*** | (2006.01) |
| ***G11C 8/18*** | (2006.01) |
| ***G11C 7/06*** | (2006.01) |
| ***G11C 8/08*** | (2006.01) |
| ***G11C 8/10*** | (2006.01) |
| ***G11C 7/12*** | (2006.01) |

(52) U.S. Cl.
CPC ................ *G11C 8/18* (2013.01); *G11C 7/065* (2013.01); *G11C 7/12* (2013.01); *G11C 8/08* (2013.01); *G11C 8/10* (2013.01)

(58) Field of Classification Search
CPC .. G11C 8/18; G11C 7/065; G11C 8/08; G11C 8/10
USPC ........................................................ 365/203
See application file for complete search history.

(56) References Cited

U.S. PATENT DOCUMENTS

| | | | | |
|---|---|---|---|---|
| 9,202,531 | B2 | 12/2015 | Seo | |
| 10,074,408 | B2 | 9/2018 | Seo | |
| 10,224,093 | B2 * | 3/2019 | Kim | G11C 7/02 |
| 2014/0003175 | A1 | 1/2014 | Jung et al. | |
| 2015/0036444 | A1 | 2/2015 | Seo | |
| 2018/0061461 | A1 | 3/2018 | Seo | |
| 2018/0182449 | A1 * | 6/2018 | Kim | G11C 5/025 |

OTHER PUBLICATIONS

U.S. Appl. No. 16/038,063, titled "Apparatuses and Methods for Reducing Row Address to Column Address Delay", filed Jul. 17, 2018.

* cited by examiner

*Primary Examiner* — Xiaochun L Chen
(74) *Attorney, Agent, or Firm* — Dorsey & Whitney LLP

(57) ABSTRACT

Apparatuses and methods for reducing row address (RAS) to column address (CAS) delay are disclosed. An example apparatus includes a memory including a sense amplifier configured to, during a precharge phase, couple a first gut node of the sense amplifier to a second gut node of the sense amplifier and to a precharge voltage while the first gut node and the second gut node are coupled to a first digit line and a second digit line, respectively, at a first time. The sense amplifier is further configured to, during the precharge phase, decouple the first gut node from the first digit line and decouple the second gut node from the second digit line at a second time that is after the first time. The sense amplifier is further configured to transition to an activation phase in response to an activate command at a third time after the second time to perform a sense operation.

20 Claims, 7 Drawing Sheets

APPARATUSES AND METHODS FOR REDUCING ROW ADDRESS TO COLUMN ADDRESS DELAY

CROSS-REFERENCE TO RELATED APPLICATION (S)

This application is a continuation of U.S. patent application Ser. No. 16/038,063, filed Jul. 17, 2018. This application is incorporated by reference herein in its entirety and for all purposes.

BACKGROUND

High data reliability, high speed of memory access, and reduced chip size are features that are demanded from semiconductor memory. In recent years, there has been an effort to further increase the clock speed of memories without sacrificing reliability, which, for a fixed number of clock cycles, effectively reduces an absolute time period available to perform a memory operation. One area of a memory access operation that is independent of the faster clock speeds is the time it takes to charge and discharge access lines during a memory access operation. As clock speeds increase, charging and discharging of access lines may consume an increasingly larger share of allotted time to perform some memory access operations. One time period of a memory access operation that helps define a total latency within a memory to provide data from a memory cell at an output is a minimum row address (RAS) to column address (CAS) delay, or tRCD. The tRCD is a minimum number of clock cycles required between activating a row of memory and accessing a memory cell in a column of the memory cells coupled to the activated row. Reducing the tRCD may provide more time margin for a memory device.

DETAILED DESCRIPTION OF THE EMBODIMENTS

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
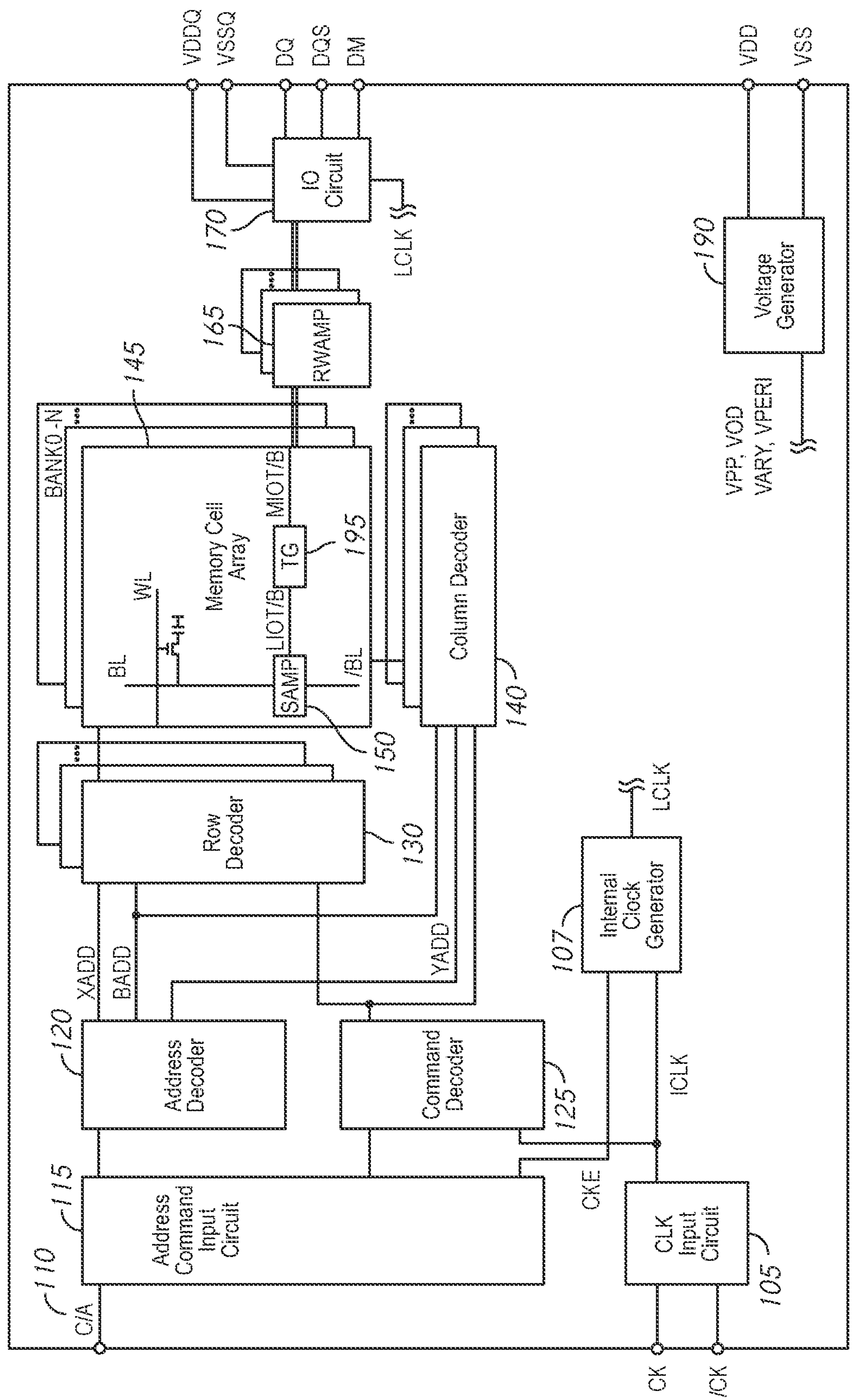
FIG. 1 is a schematic block diagram of a semiconductor device, in accordance with an embodiment of the present disclosure.

FIG. 1 is a schematic block diagram of a semiconductor device 100, in accordance with an embodiment of the present disclosure. The semiconductor device 100 may include a clock input circuit 105, an internal clock generator 107, a timing generator 109, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and/CK, data terminals DQ, DQS, and DM, and power supply terminals VDD, VSS, VDDQ, and VSSQ. The terminals and signal lines associated with the command/address bus 110 may include a first set of terminals and signal lines that are configured to receive the command signals and a separate, second set of terminals and signal lines that configured to receive the address signals, in some examples. In other examples, the terminals and signal lines associated with the command and address bus 110 may include common terminals and signal lines that are configured to receive both command signal and address signals. The semiconductor device may be mounted on a substrate, for example, a memory module substrate, a motherboard or the like.

The memory cell array 145 includes a plurality of banks BANK0-N, where N is a positive integer, such as 3, 7, 15, 31, etc. Each bank BANK0-N may include a plurality of word lines WL, a plurality of bit lines BL, and a plurality of memory cells MC arranged at intersections of the plurality of word lines WL and the plurality of bit lines BL. The selection of the word line WL for each bank BANK0-N is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches. The sense amplifiers 150 and transfer gates TG 195 may be operated based on control signals from decoder circuitry, which may include the command decoder 120, the row decoders 130, the column decoders 140, any control circuitry of the memory cell array 145 of the banks BANK0-N, or any combination thereof. In some examples, the tRCD for the semiconductor device 100 may involve operations of the row decoders 130, the column decoders 140, and circuitry of the memory cells array 145 of each of the plurality of banks BANK0-N (e.g., including the plurality of sense amplifiers 150 and the transfer gates TG 195). In some examples, the plurality of sense amplifiers 150 may include threshold voltage compensation circuitry that compensates for threshold voltage differences between components of the sense amplifiers 150. As circuit components become smaller, clock speeds become faster, and voltage/power consumption requirements are reduced, small variance between circuit components introduced during fabrication (e.g., process, voltage, and temperature (PVT) variance) may reduce operational reliability of the semiconductor device 100. To mitigate effects of these variations, compensating for some of these threshold voltage Vt differences may include, before activating the sense amplifier 150 to sense data, biasing bit lines BL and /BL coupled to the sense amplifiers 150 using internal nodes of the sense amplifier 150 that are configured to provide sensed data to an output (e.g., gut nodes). The bias of the bit lines BL and /BL may be based on threshold differences between at least two circuit components (e.g., transistors) of the sense amplifier 150. While compensating for threshold voltage Vt differences between circuit components within the sense amplifier 150 may improve reliability, adding an additional phase (e.g., the threshold voltage compensation phase) to a sense operation may increase the tRCD.

In some examples, adjusting or changing timing of steps of some operations of a sense operation may improve tRCD. For example, the memory cell array 145 and the plurality of sense amplifiers 150 may operate in two general phases or modes. A first phase (e.g., precharge phase) may be initiated in response to a precharge command PRE. During the precharge phase, the wordlines WL may be set to an inactive state, and bit lines BL and /BL and internal nodes of the plurality of sense amplifiers 150 that are configured to provide a sensed data state to an output (e.g., gut nodes) may be precharged to and held at a precharge voltage, such as a bit line precharge voltage VBLP, until transitioning to a second phase. That is, the precharge phase may initialize the circuitry of the memory cell array 145 to be ready to start a memory access operation. A second phase (e.g., activation phase) may be initiated in response to an activate command ACT. During the activation phase, a wordline WL may be set to an active state, and some of the bit lines BL and /BL and internal nodes of some of the plurality of sense amplifiers 150 may be configured to perform a sense operation to sense data states of a row of memory cells coupled to the active wordline WL. After the memory access operation, the memory cell array 145 may remain in the activation phase or may transition back to the precharge phase in response to a precharge command PRE.

In some examples, during the threshold voltage compensation operation, the gut nodes of the sense amplifiers 150 may be isolated from the corresponding bit lines BL and /BL. In some examples, the decoder circuitry may be configured to isolate the gut nodes of the sense amplifiers 150 from the corresponding bit lines BL and /BL during the precharge phase. For example, part of the precharge phase includes coupling the respective gut nodes of the sense amplifiers 150 to each other, to corresponding bit lines BL and /BL, and to a precharge voltage in order to precharge each to the precharge voltage. After a delay from initiation of this precharge operation, the decoder circuitry may be configured to isolate the gut nodes of the sense amplifiers 150 from the corresponding bit lines BL and /BL. By initiating the isolation during the precharge phase, rather than in response to the activate command ACT, a time to perform the sense operation during the activation phase may be reduced, which may reduce tRCD. That is, by eliminating a latency after receipt of the activate command ACT to initiate the isolation of the gut nodes of the sense amplifiers 150 from the corresponding bit lines BL and /BL, as well as moving at least a portion of signal transition latency associated with the isolation to the precharge phase, subsequent phases of the sense operation may begin earlier, which may allow the sense operation to be completed in a shorter amount of time, and this time reduction for the sense operation directly reduces tRCD.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and generate various internal command signals. For example, the internal command signals may include a row command signal to select a word line, or a column command signal, such as a read command or a write command, to select a bit line.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when the write command is issued and a row address and a column address are timely supplied with the write command, and then the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, the clock terminals CK and/CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The IO circuit 170 may receive the power supply voltages VDD and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
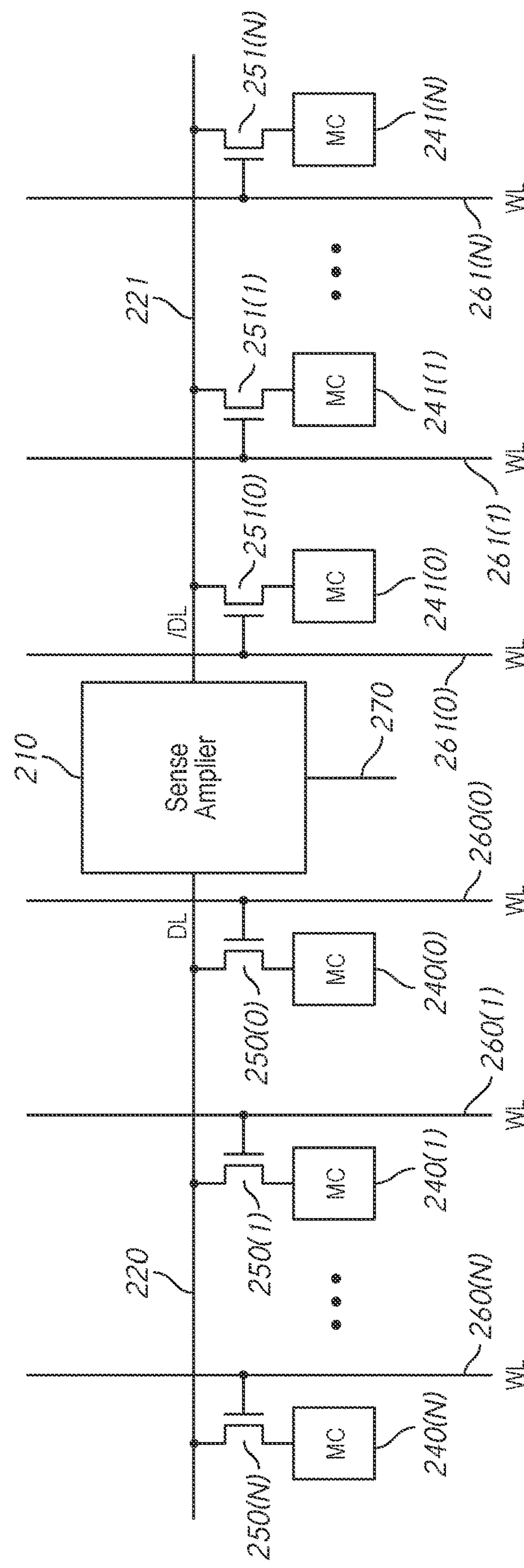
FIG. 2 is a schematic diagram of a sense amplifier and a pair of complementary digit lines in accordance with an embodiment of the disclosure.

FIG. 2 is a schematic diagram of a portion of a memory 200 that includes a sense amplifier 210 and a pair of complementary digit lines DL 220 and /DL 221 in accordance with an embodiment of the disclosure. As shown in FIG. 2, the sense amplifier 210 is coupled to the pair of true and complementary digit (or bit) lines DL 220 and /DL 221. The memory cells 240(0)-(N) may be selectively coupled through respective access devices (e.g., transistors) 250(0)-(N) to the digit line DL 220 and memory cells 241(0)-(N) may be selectively coupled through respective access devices (e.g., transistors) 251(0)-(N) to the digit line /DL 221. Wordlines WL 260(0)-(N) may control which of the memory cells 240(0)-(N) is coupled to the digit line DL 220 by controlling a gate of a respective access device 250(0)-(N). Similarly, wordlines WL 261(0)-(N) may control which of the memory cells 241(0)-(N) is coupled to the digit line DL 221 by controlling a gate of a respective access device 251(0)-(N). The sense amplifier 210 may be controlled via control signals 270 received via a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof.

In some examples, the memory 200 may operate in two general phases or modes. A first phase (e.g., precharge phase) may be initiated in response to a precharge command PRE. During the precharge phase, the wordlines WL 260 (0)-(N) and 261(0)-(N) may be set to an inactive state, and in response, the access devices 250(0)-(N) and 251(0)-(N) may all be disabled. Further, the digit lines DL 220 and /DL 221 and internal nodes of the sense amplifier 210 that are configured to provide a sensed data state to an output (e.g., gut nodes) may be precharged to and held at a precharge voltage, such as a bit line precharge voltage VBLP, until transitioning to a second phase.

A second phase (e.g., activation phase) may be initiated in response to an activate command ACT. During the activation phase, a wordline WL of the wordlines WL 260(0)-(N) and 261(0)-(N) may be set to an active state, and, in response, an access device of the access devices 250(0)-(N) and 251(0)-(N) may be enabled to couple a memory cell of the memory cells 240(0)-(N) and 241(0)-(N to one of the digit lines DL 220 and /DL 221. The sense amplifier 210 may be configured to perform a sense operation to sense a data state of the coupled memory cell. That is, during a sense operation, a data state stored by the coupled memory cell is sensed and amplified by the sense amplifier 210 to drive one of the digit line DL 220 or the digit line DL/220 to a high or low voltage level corresponding to the sensed data state and to drive the other digit line of the digit lines DL 220 and /DL 221 to the complementary voltage level during the sense operation. After the memory access operation, the circuitry of the memory 200 may remain in the activation phase or may transition back to the precharge phase in response to a precharge command PRE.

Similarly, a memory cell of the memory cells 241(0)-(N) is coupled to the digit line /DL 221 through the respective access device 251(0)-(N) in response to a respective word line 261(0)-(N) becoming active. A data state stored by the memory cell is sensed and amplified by the sense amplifier 210 to drive the digit line /DL 221 to a high or low voltage level corresponding to the sensed data state. The other digit line DL 220 is driven to the complementary voltage level during the sense operation.

In some examples, sense amplifier 210 may include threshold voltage compensation circuitry that compensates for threshold voltage differences between components of the sense amplifier 210 during the sense operation of the activation phase. To perform the threshold voltage compensation, the sense amplifier 210 may, during a threshold voltage compensation phase of the sense operation, precharge or bias the digit lines DL 220 and /DL 221 such that a voltage difference between the digit line DL 220 and the /DL 221 is approximately equal to threshold voltage differences between at least two circuit components of the sense amplifier 210. In some examples, the threshold voltage difference may be based on threshold voltages of Nsense transistors of the sense amplifier 210. While compensating for threshold voltage Vt differences between circuit components within the sense amplifier 210 may improve reliability, adding an additional phase (e.g., the threshold voltage compensation phase) to a sense operation may increase the tRCD.

During the threshold voltage compensation operation, the gut nodes of the sense amplifier 210 may be isolated from the digit lines DL 220 and /DL 221 in response to the control signals 270 (e.g., from a decoder circuit). In some examples, the control signals 270 may configure the sense amplifier 210 to isolate the gut nodes from the digit lines DL 220 and /DL 221 during the precharge phase. For example, during the precharge phase, the gut nodes of the sense amplifier 210 may be coupled to each other, to the digit lines DL 220 and /DL 221, and to a precharge voltage (e.g., VBLP) to precharge each to the precharge voltage. After a delay from initiation of this precharge operation and while still in the precharge phase, the control signals 270 may configure the sense amplifier 210 to isolate the gut nodes from the digit lines DL 220 and /DL 221. By performing the isolation during the precharge phase, rather than in response to the activate command ACT, a time to perform the sense operation may be reduced, which may reduce tRCD. That is, by eliminating a latency after receipt of the activate command ACT to initiate the isolation of the gut nodes of the sense amplifier 210 from the digit lines DL 220 and /DL 221, as well as moving at least a portion of the isolation signal transition latency to the precharge phase, subsequent phases of the sense operation that occur during the activation phase may begin earlier, which may allow the sense operation to be completed in a shorter amount of time. The reduced time may directly reduce tRCD.

Figure 3:
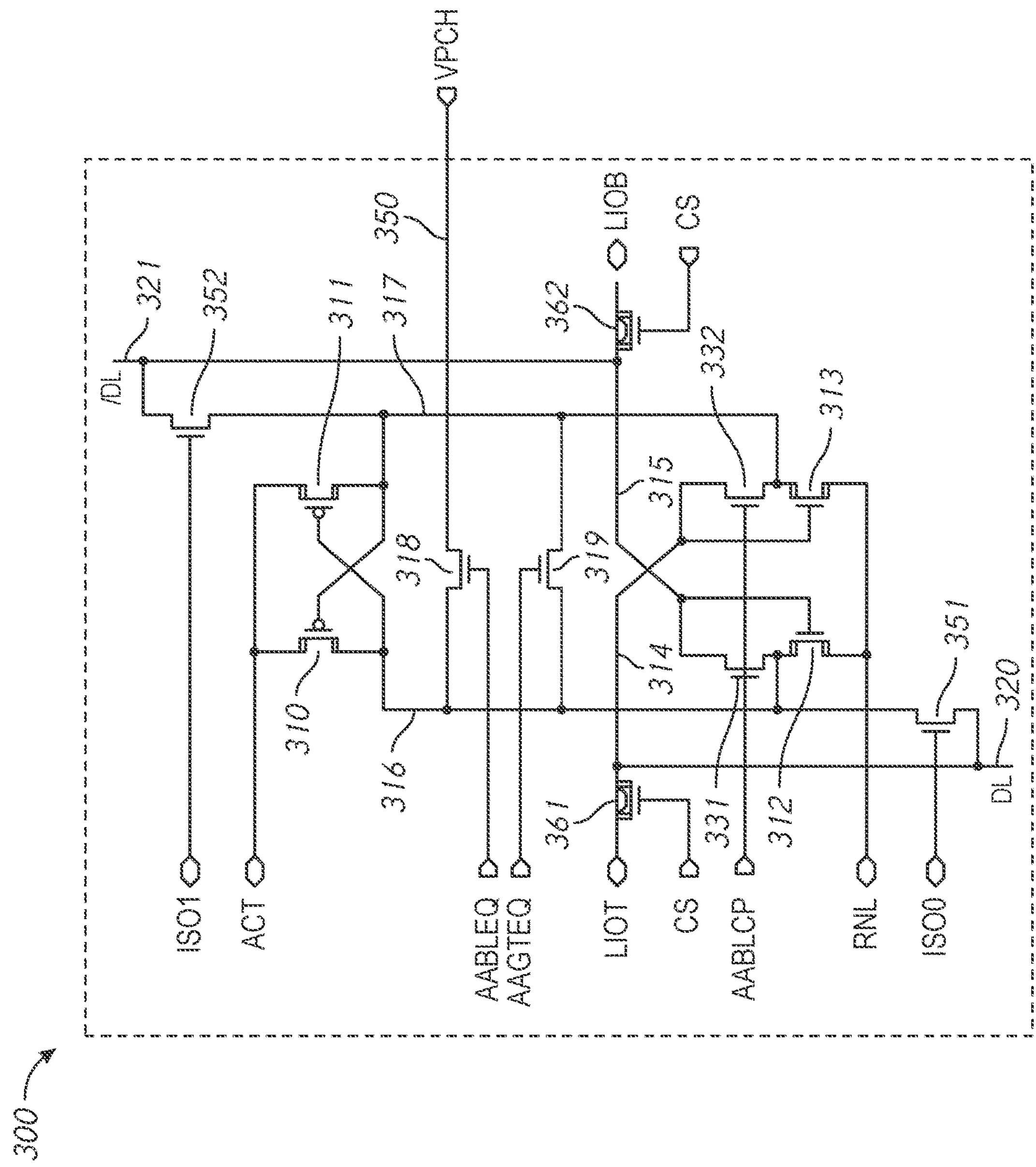
FIG. 3 is a circuit diagram of a sense amplifier in accordance with an embodiment of the disclosure.

FIG. 3 is a circuit diagram of a sense amplifier 300 in accordance with an embodiment of the disclosure. The sense amplifier 300 may be included in one or more of the sense amplifiers 150 of FIG. 1 and/or the sense amplifier 210 of FIG. 2. The sense amplifier 300 may include first type of transistors (e.g. p-type field effect transistors (PFET)) 310, 311 having drains coupled to drains of second type of transistors (e.g., n-type field effect transistors (NFET)) 312, 313, respectively. The first type of transistors 310, 311 and the second type of transistors 312, 313 form complementary transistor inverters including a first inverter including the transistors 310 and 312 and a second inverter including the transistors 311 and 313. The first type of transistors 310, 311 may be coupled to a Psense amplifier control line (e.g., an activation signal ACT), which may provide a supply voltage (e.g., an array voltage VARY) at an active "high" level. The second type of transistors 312, 313 may be coupled to an Nsense amplifier control line (e.g., a Row Nsense Latch signal RNL) that may provide a reference voltage (e.g., a ground (GND) voltage) at an active "low" level. The sense amplifier 300 may sense and amplify the data state applied to sense nodes 314, 315 through the digit (or bit) lines DL 320 and /DL 321, respectively. Nodes 316 and 317 that may be gut nodes coupled to drains of the second type of transistors 312, 313 may be coupled to the digit lines DL 320 and /DL 321 via isolation transistors 351 and 352. The isolation transistors 351 and 352 may be controlled by isolation signals ISO0 and ISO1. The digit lines DL 320 and /DL 321 (sense nodes 314 and 315) may be coupled to local input/output nodes A and B (LIOA/B) through the second type of transistors 361 and 362, respectively, which may be rendered conductive when a column select signal CS is active. LIOT and LIOB may correspond to the LIOT/B lines of FIG. 1, respectively.

The sense amplifier 300 may further include additional second type of transistors 331, 332 that have drains coupled to the sense nodes 315 and 314 and sources coupled to both the gut nodes 316 and 317 and the drains of the second type of transistors 312 and 313. Gates of the second types of transistors 331, 332 may receive a bit line compensation signal AABLCP and may provide voltage compensation for threshold voltage imbalance between the second type of transistors 312 and 313. The sense amplifier 300 may further include transistors 318, 319, where the transistor 318 may couple the gut node 316 to a global power bus 350 and the transistor 319 may couple the gut node 316 to the gut node 317. The global power bus 350 may be coupled to a node that is configured to a precharge voltage VPCH. In some examples, the VPCH voltage is bit line precharge voltage VBLP. In some examples, the VPCH voltage may be set to the VARY voltage during some phases of a sense operation. The voltage of the array voltage VARY may be less than the voltage of the bit line precharge voltage VBLP. In some examples, the bit line precharge voltage VBLP may be approximately one-half of the array voltage VARY. The transistors 318 and 319 may couple the global power bus 350 to the gut nodes 316 and 317 responsive to equilibrating signals AAGTEQ and AABLEQ provided on gates of the transistors 318 and 319.

In some examples, the sense amplifier 300 may operate in two general phases or modes. A first phase (e.g., precharge phase) may be initiated in response to a precharge command PRE. During the precharge phase, all wordlines WL may be set to an inactive state, and in response, the access devices may all be disabled. Further, the digit lines DL 320 and /DL 321 and the gut nodes 316, 317 of the sense amplifier 300 may be precharged to and held at a precharge voltage VPCH, such as the VBLP voltage, until transitioning to a second phase. A second phase (e.g., activation phase) may be initiated in response to an activate command ACT. During the activation phase, the sense amplifier 300 may be configured to sense a data state of a coupled memory cell on the digit lines DL 320 and /DL 321 in response to received control signals (e.g., the ISO0/ISO1 isolation signals, the ACT and RNL signals, the AABLEQ and AAGTEQ equalization signals, the CS signal, and the AABLCP signal). The control signals may be provided by a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof.

Figure 4:
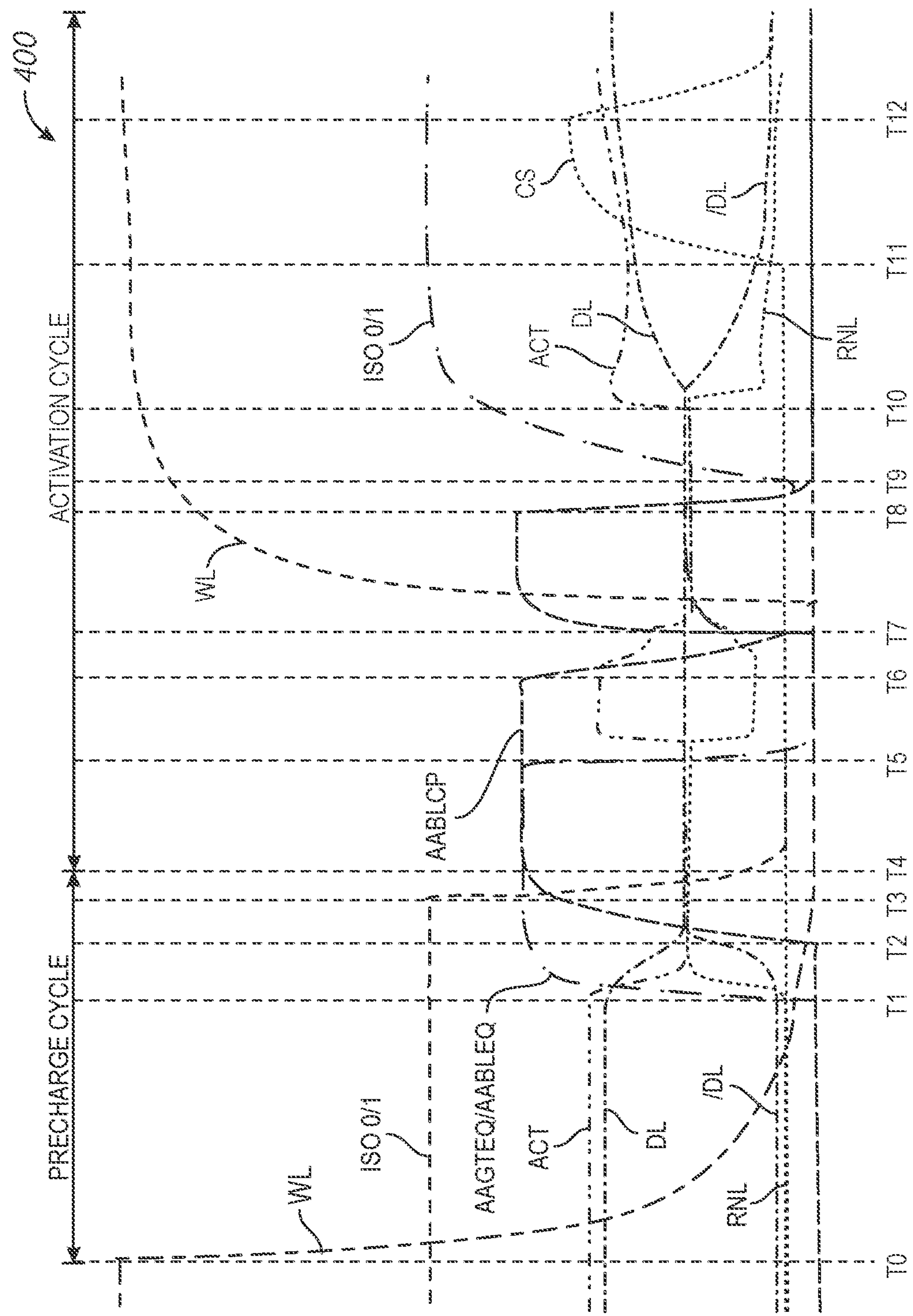
FIG. 4 is an illustration of an exemplary timing diagram depicting signal transition during a precharge cycle and an activate cycle using the sense amplifier in accordance with an embodiment of the disclosure.

FIG. 4 is an illustration of an exemplary timing diagram 400 depicting signal transition during a precharge cycle and an activate cycle using the sense amplifier 300 in accordance with an embodiment of the disclosure. The precharge cycle is from times T0 to T4, and the activation cycle is from times T4 to at least time T12.

During the precharge cycle, the wordline WL may transition to an inactive state, starting at time T0. At time T0, the digit lines DL 320 and /DL 321 may hold the sense data state from a previous activation phase in response to the ACT signal and the RNL signal being set to the logic high level (e.g., the VARY voltage) and the logic low level (e.g., the GND voltage), respectively. The ISO0/1 signals may remain in an active state from a preceding activation phase. In response to the ISO0/1 signals being in an active state, the transistors 351, 352 may be enabled to couple the digit lines DL 320 and /DL 321 to the gut nodes 316, 317. At time T1, the AAGTEQ and AABLEQ signals may transition to an active state and the ACT signal and the RNL signal may transition to the VPCH voltage (e.g., the VBLP voltage). In response to the AAGTEQ and AABLEQ signals transitioning to the active state, the transistors 318 and 319 may couple the VPCH voltage from the global power bus 350 to each of the gut nodes 316, 317, and in response to the ISO0/1 signals remaining in the active state to enable the transistors 351, 352, the VPCH voltage is also coupled to the digit lines DL 320 and /DL 321 via the gut nodes 316, 317. Thus, starting at time T1, the sense nodes 314 and 315, the gut nodes 316, 317, and the digit lines DL 320 and /DL 321 may start transitioning to the VPCH voltage. The VPCH voltage may be set to the VBLP voltage, in some examples.

At time T2, the AABLCP signal may transition to an active state. In response to the AABLCP transitioning to the active state, the transistors 331, 332 may be enabled to couple the gut node 316 to the digit line /DL 321 and the gut node 317 to the DL 320 in preparation for a threshold voltage compensation operation. Between times T1 and T3, the sense nodes 314 and 315, the gut nodes 316, 317, and the digit lines DL 320 and /DL 321 may transition (e.g., precharge) to the VPCH voltage. At time T3, the ISO0/1 signals may transition to an inactive state. In response to the ISO0 and ISO1 signals transitioning to the inactive state, the isolation transistors 351 and 352 may decouple the gut nodes 317 and 316 from the digit lines DL 320 and /DL 321. Therefore, after the gut nodes 316, 317 and the digit lines DL 320 and /DL 321 have transitioned (e.g., precharged) to the VPCH voltage and while still in the precharge phase, the gut nodes 316, 317 are isolated from the digit lines DL 320 and /DL 321 to prepare for the threshold voltage compensation phase. The time at which the ISO0/1 signals are set to the inactive state may be based on delay from the time the AAGTEQ and AABLEQ signals set to the active state. Thus, the time T1 to time T3 may be a preconfigured delay. The delay may be based on an amount of time to allow the sense nodes 314 and 315, the gut nodes 316, 317, and digit lines DL 320 and /DL 321 to precharge to the VPCH voltage. By setting the ISO0/1 signals to the inactive state during the precharge phase, the time to perform the sense operation during the activation phase may be reduced, which may directly reduce tRCD.

At time T4, the sense amplifier 300 may transition to an activation phase in response to an activate command ACT. During the activation phase, the sense amplifier 300 may perform a sense operation. A sense operation may include several phases, such as an initial or standby phase, a compensation phase, a gut equalize phase, and a sense phase. During the initial phase (e.g., between times T4 to T5 of the timing diagram 400 of FIG. 4), the gut nodes 316 and 317 may be precharged at the VPCH voltage. For example, the global power bus 350 may be supplied with the VPCH voltage and the AABLCP signal, and the AAGTEQ and AABLEQ signals may be in their active states, respectively. Accordingly, while in the initial phase, each of the digit lines DL 320 and /DL 321, the sense nodes 314 and 315, and the gut nodes 316 and 317 may be precharged to the precharge voltage VPCH. In some examples, the VPCH voltage may be the VBLP voltage. The VBLP voltage may be approximately half of the VARY voltage.

After the initial phase, the sense amplifier 300 may enter the threshold voltage compensation phase (e.g., to perform a threshold voltage compensation operation) (e.g., between times T5 and T6 of the timing diagram 400 of FIG. 4), where voltages on the data lines DL 320 and /DL 321 are biased from the VPCH voltage (e.g., VBLP voltage) to compensate (e.g., provide threshold voltage compensation) for threshold voltage differences between the transistors 312, 313. During the compensation phase, at time T5, the AAGTEQ and AABLEQ signals may be set to respective inactive state to disable the transistors 318 and 319, after transition of the AAGTEQ and AABLEQ signals, the ACT and RNL signals set to the logic high level (e.g., the VARY voltage) and the logic low level (e.g., the GND voltage), respectively. The AABLCP signal may remain in an active state to enable the transistors 331 and 332 to couple the nodes 314 and 315 to the gut nodes 317 and 316, respectively. Additionally, the drain and the gate of the transistor 312 may be coupled and the drain and the gate of the transistor 313 may be coupled. At time T6, the compensation phase may be completed by transitioning the AABLCP signal to an inactive state and the ACT and RNL signals to the VPCH voltage. The AABLCP signal transitioning to the inactive state may disable the transistors 331 and 332 and decouple the nodes 314 and 315 from the gut nodes 317 and 316, respectively.

During the gut equalize phase (e.g., between times T7 and T8 of the timing diagram 400 of FIG. 4), the gut nodes 317 and 316 may be decoupled from the digit lines DL 320 and /DL 321 and may be coupled to each other to equalize voltages between the gut nodes 316, 317 to the VPCH voltage. During this phase, at time T7, the AAGTEQ and AABLEQ signals may transition to an active state. While the AABLCP signal is set to the inactive state, the transistors 332 and 331 may decouple the nodes 314 and 315 from the gut nodes 317 and 316. While the AAGTEQ and AABLEQ signals are set to the active state, the transistors 318 and 319 may couple the VPCH voltage from the global power bus 350 to the gut nodes 316, 317. While the ISO0 and ISO1 signals are set to the inactive state, the isolation transistors 351 and 352 may decouple the gut nodes 317 and 316 from the digit lines DL 320 and /DL 321. After the to the gut nodes 316 and 317 are precharged to the VPCH voltage, the AAGTEQ and AABLEQ signals may be set to inactive states to disable the transistors 318 and 319, at time T8. Also during the gut equalization phase, at time T7, a wordline WL (e.g., any of the wordlines WL 260(0)-(N) or the wordlines WL 261(0)-(N) of FIG. 2) associated with the sense operation may be set to an active state. In some other examples, the wordline WL may be activated during the threshold voltage compensation phase.

During the sense phase (e.g., between times T9 and T12 of the timing diagram 400 of FIG. 4), the sense amplifier 300 may sense a data state of memory cell coupled to the digit line DL 320 or /DL 321. At time T9, the ISO0 and ISO1 isolation signals may be set to an active state. At time T10, the ACT signal and the RNL signal may be activated and set to the logic high level (e.g., the VARY voltage) and the logic low level (e.g., the GND voltage), respectively. Responsive to the ISO0 and ISO1 isolation signals transitioning to the active state, the ISO transistor 351 may couple the digit line DL 320 to the gut node 316 and the ISO transistor 352 may couple the digit line /DL 321 to the gut node 317. During the sense phase, sense and amplify operations are then performed with the threshold voltage compensation voltage to balance the responses of the second type of transistors 312 and 313. For example, in response to a memory cell (e.g., one of the memory cells 240(0)-(N) or memory cells 241 (0)-(N) of FIG. 2) being coupled to a digit line DL 320 or /DL 321 through its respective access device (e.g., the respective access device 250(0)-(N) or access device 251 (0)-(N) of FIG. 2), a voltage difference is created between the digit lines DL 320 and /DL 321 (e.g., via the guts nodes 316 and 317). Thus, at time T11, the voltage difference is sensed by the second type of transistors 312, 313 as the sources of the second type of transistors 312, 313 begin to be pulled to ground through fully activated RNL signal, and one of the second type of transistors 312, 313 with a gate coupled to the digit line DL 320 or /DL 321 with the slightly higher voltage begins conducting. When a memory cell coupled to the gut node 316 through the digit line DL 320 stores a high data state, for example, the transistor 313 may begin conducting. Additionally, the other transistor 312 may become less conductive as the voltage of the gut node 317 with the slightly lower voltage decreases through the conducting transistor 313. Thus, the slightly higher and lower voltages are amplified to logic high and logic low voltages while the isolation signals ISO0 and ISO1 in the active state.

After the data state of the memory cell is sensed, and the sense nodes 314, 315 are each pulled to a respective one of the ACT signal and RNL signal voltages, a read may be performed in response to a READ command. For example, at time T12, the CS signal may be activated (e.g., in response to the READ command), the digit lines DL 320 and /DL 321 (e.g., at sense nodes 314 and 315) may be coupled to the LIO nodes (LIOT and LIOB) and the data output may be provided to the LIO nodes. Thus, the data may be read out from the LIO nodes. After a read operation is completed, at time T13, the CS signal may be set to an inactive state. The process may start over for a second sensing operation.

Figure 5:
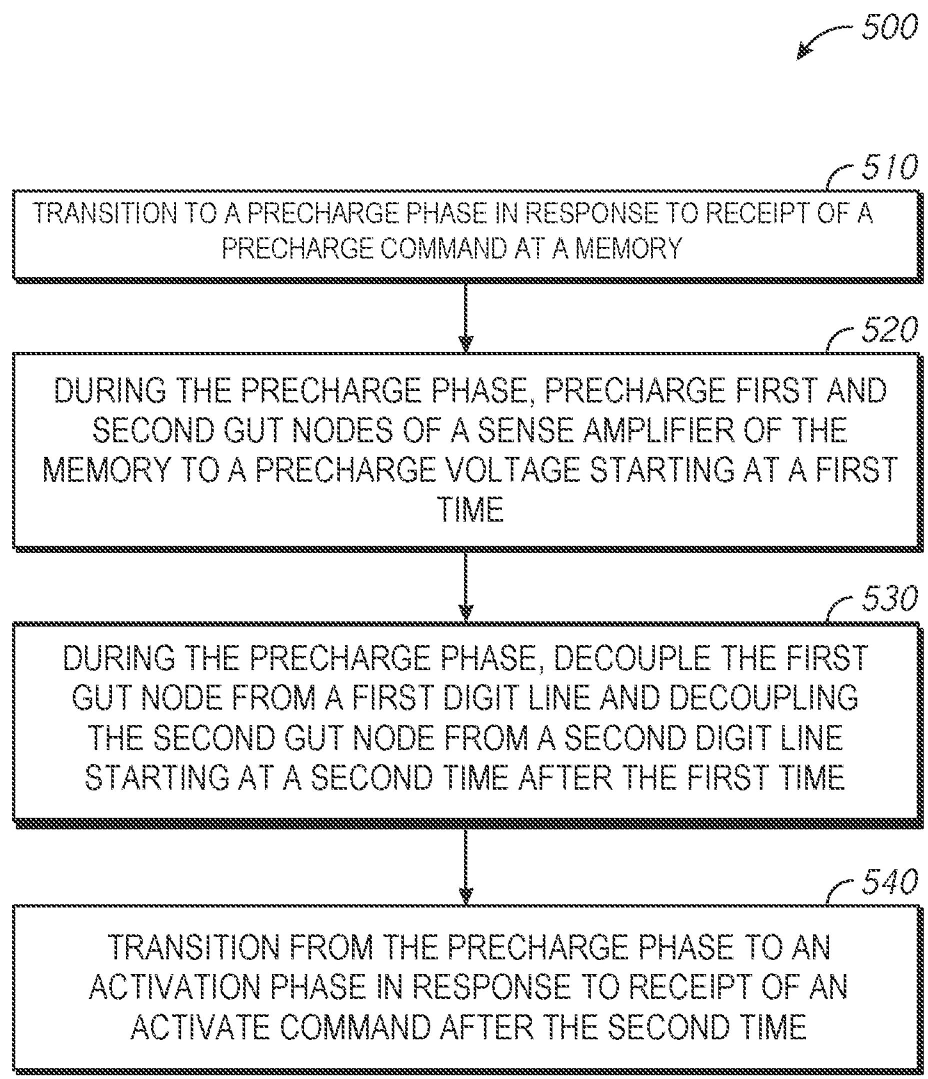
FIG. 5 is a flow diagram of a method for operation of a sense amplifier including transition of an isolation signal to an inactive state during a precharge phase in accordance with embodiments of the disclosure.

FIG. 5 is a flow diagram of a method 500 for operation of a sense amplifier including transition of an isolation signal to an inactive state during a precharge phase in accordance with embodiments of the disclosure. The method 500, all or in part, may be performed by the semiconductor device 100, a decoder circuit (e.g., any of the command decoder 125, the row decoder 130, the column decoder 140, any control circuitry of the memory cell array 145 of the memory banks BANK0-N, or any combination thereof) and/or the sense amplifiers 150 of FIG. 1, the sense amplifier 210 of FIG. 2, the sense amplifier 300 of FIG. 3, or combinations thereof.

The method 500 includes transitioning to a precharge phase in response to receipt of a precharge command at a memory, at 510. The precharge command may be received via a command and address bus, such as the command address bus 110 of FIG. 1. The precharge command may be decoded at a command decoder, such as the command decoder 125 of FIG. 1. The precharge phase may include some or all operations described with reference to the timing diagram 400 of FIG. 4 between times T0 and T4, the timing diagram 600 of FIG. 6 between times T0 and T4, the timing diagram 700 of FIG. 7 between times T0 and T3, or combinations thereof.

The method 500 may further include, during the precharge phase, precharging first and second gut nodes of a sense amplifier of the memory to a precharge voltage starting at a first time, at 520. The sense amplifier may include any of the sense amplifiers 150 of FIG. 1, the sense amplifier 210 of FIG. 2, or the sense amplifier 300 of FIG. 3. The gut nodes may include the gut nodes 316 or 317 of FIG. 3. Precharging the first and second gut nodes of the sense amplifier may include activating transistors of the sense amplifier to couple the gut nodes to the precharge voltage in response to equilibrating signals, such activation of the transistors 318 and 319 of FIG. 3 to couple the VPCH voltage to each of the gut nodes 316, 317 in response to the as the AAGTEQ and AABLEQ signals transitioning to the active state.

The method 500 may further include, during the precharge phase, decoupling the first gut node from a first digit line and decoupling the second gut node from a second digit line starting at a second time after the first time, at 530. The first and second digit lines may correspond to any of the BL or /BL of FIG. 1, the digit lines DL 220 or /DL 221 of FIG. 2, or the digit lines DL 320 or /DL 321 of FIG. 3. The precharge voltage may correspond to the VPCH voltage and/or the VBLP voltage of FIG. 3, the VBLP voltage of FIG. 6, or combinations thereof. A delay between the first and second times is based on time to precharge the first and second gut nodes to the precharge voltage. The method 500 may further include, during the precharge phase, cross-coupling the first gut node with the second digit line and the second gut node with the first digit line.

The method 500 may further include transitioning from the precharge phase to an activation phase in response to receipt of an activate command after the second time, at 530. The activate command may be received via a command and address bus, such as the command address bus 110 of FIG. 1. The activate command may be decoded at a command decoder, such as the command decoder 125 of FIG. 1. The activation phase may include some or all operations described with reference to the timing diagram 400 of FIG. 4 between times T4 and T11, the timing diagram 600 of FIG. 6 between times T4 and T11, the timing diagram 700 of FIG. 7 starting from time T3, or combinations thereof.

In some examples, the method 500 may include, during the activation phase, performing a threshold voltage compensation operation to bias the first and second digit lines based on a threshold voltage difference between at least two circuit components of the sense amplifier, and sensing a data state of a memory cell of the memory that is coupled to one of the first or second digit lines after performing the threshold voltage compensation operation. In some examples, the at least two circuit components of the sense amplifier may include the transistors 312 and 313 of FIG. 3. The memory cell may be coupled to a digit line of the digit lines in response to activation of the wordline. The memory cell may include the memory cell depicted in FIG. 1 or any of the memory cells 240(0)-(N) or 241(0)-(N) of FIG. 2. The memory cell may be coupled to the digit line via an access device, such as any of the access devices 250(0)-(N) or 251(0)-(N) of FIG. 2.

Figure 6:
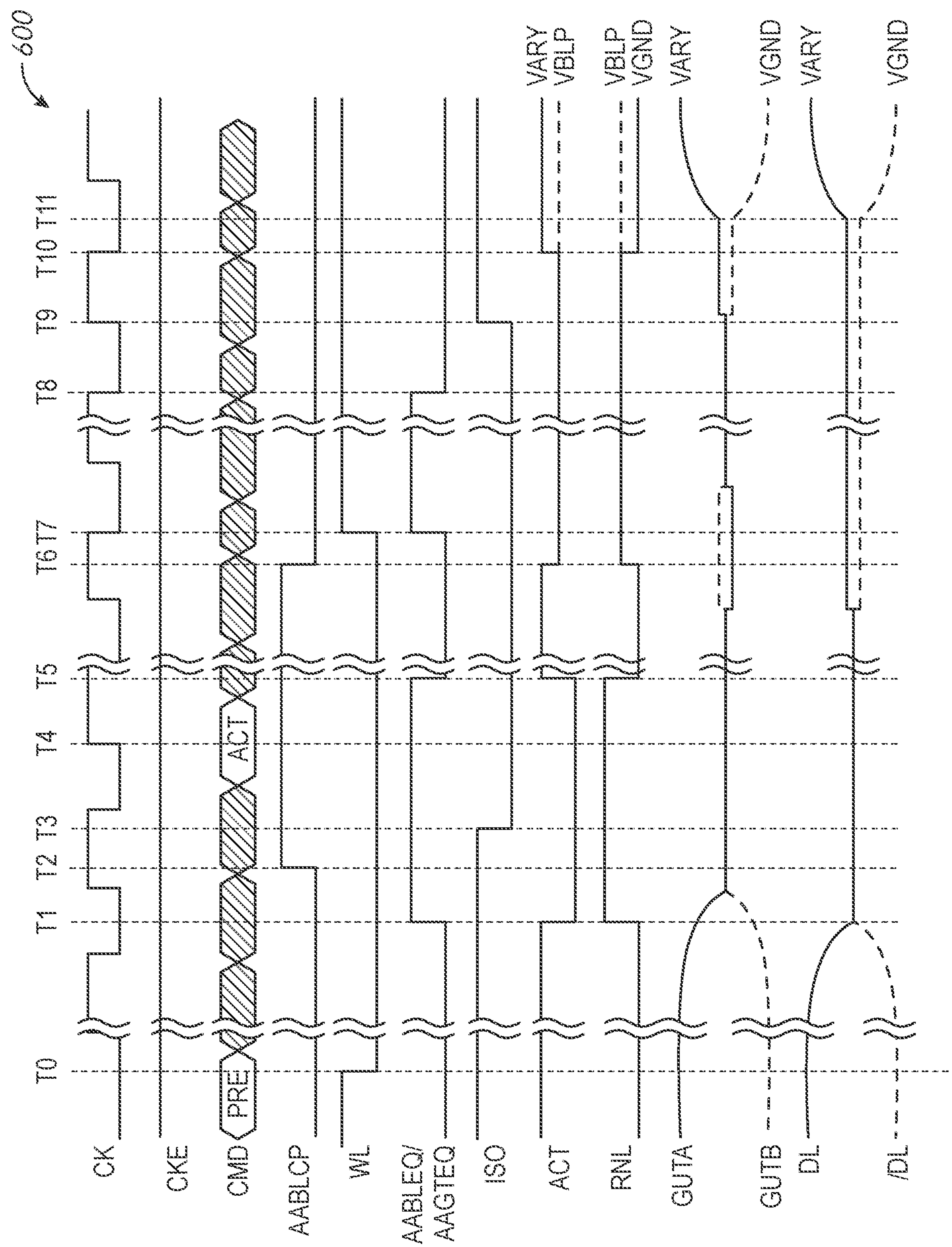
FIG. 6 is an illustration of an exemplary timing diagram depicting operation of a sense amplifier including transition of an isolation signal ISO to an inactive state during a precharge phase in accordance with embodiments of the disclosure.

FIG. 6 is an illustration of an exemplary timing diagram 600 depicting operation of a sense amplifier including transition of an isolation signal ISO to an inactive state during a precharge phase in accordance with embodiments of the disclosure. In some examples, the timing diagram 600 may depict operation of the semiconductor device 100 and/or one of the sense amplifiers 150 of FIG. 1, the sense amplifier 210 of FIG. 2, the sense amplifier 300 of FIG. 3, or combinations thereof. The CK and CKE signals may correspond to the CK and CKE signals of FIG. 1. The CMD signal may correspond to a command signal received at via the command and address bus 110 of FIG. 1. The WL signal may correspond to voltages transmitted on the word lines WL of FIG. 1, the word lines WL 260(0)-(N) and word lines WL 261(0)-(N) of FIG. 2. The AABLCP, AABLEQ, AAGTEQ, ISO, ACT, and RNL signals may correspond to the AABLCP, AABLEQ, AAGTEQ, ISO0/1, ACT, and RNL signals of FIG. 3. The GUTA and GUTB nodes may correspond to the gut nodes 316 and 317. The digit lines DL and /DL may correspond to any of the bit lines BL and /BL of FIG. 1, the digit lines DL 220 and /DL 221 of FIG. 2, or the DL 320 or /DL 321 of FIG. 3.

A sense amplifier may be configured to operate in a precharge phase and an activation phase. The timing diagram 600 depicts a precharge cycle associated with a precharge phase from times T0 to T4, and an activation cycle associated with an activation phase from times T4 to at least time T11.

While the clock enable signal CKE is active, the precharge phase may be initiated at time T0, in response to a precharge command PRE received via the CMD signal responsive to the clock signal CK. In response to the precharge command PRE, the wordline WL may begin transitioning to an inactive state starting at time T0. Also at time T0, the digit lines DL and /DL may hold the sense data state from a previous activation phase in response to the ACT signal and the RNL signal being set to the logic high level (e.g., the VARY voltage) and the logic low level (e.g., the GND voltage), respectively. The ISO signal may remain in an active state from a preceding activation phase. At time T1, the AAGTEQ and AABLEQ signals may transition to an active state and the ACT signal and the RNL signal may transition to the VBLP voltage. In response to the AAGTEQ and AABLEQ signals transitioning to the active state, the VBLP voltage may be coupled to each of the GUTA and GUTB nodes, and in response to the ISO signal remaining in the active state, the VBLP voltage may also be coupled to the digit lines DL and /DL via the GUTA and GUTB nodes. Thus, starting at time T1, the GUTA and GUTB nodes and the digit lines DL and /DL may start transitioning to the VBLP voltage.

At time T2, the AABLCP signal may transition to an active state. In response to the AABLCP transitioning to the active state, the GUTA and GUTB nodes may be cross coupled with the digit lines /DL and DL, respectively, in preparation for a threshold voltage compensation operation. At time T3, the ISO signal may transition to an inactive state. In response to the ISO signal transitioning to the inactive state, the GUTA and GUTB nodes may be decoupled from the digit lines DL and /DL, respectively. Therefore, after the GUTA and GUTB nodes and the digit lines DL and /DL have transitioned (e.g., precharged) to the VBLP voltage and while still in the precharge phase, the GUTA and GUTB nodes may be isolated from the digit lines DL and /DL 321, respectively, to prepare for the threshold voltage compensation phase. The time at which the ISO signal is set to the inactive state may be based on delay from the time the AAGTEQ and AABLEQ signals set to the active state. Thus, the time T1 to time T3 may be a preconfigured delay. The delay may be based on an amount of time to allow the GUTA and GUTB nodes, and digit lines DL and /DL to precharge to the VBLP voltage. By setting the ISO signal to the inactive state during the precharge phase, the time to perform the sense operation during the activation phase may be reduced, which may directly reduce tRCD.

At time T4, the sense amplifier may transition to an activation phase in response to an activate command ACT received via the CMD signal responsive to the clock signal CK. The ACT command may indicate a row of memory cells to be activated via the wordline WL. During the activation phase, the sense amplifier may perform a sense operation. At time T5, the AAGTEQ and AABLEQ signals may transition to an inactive state to initiate the threshold voltage compensation phase. During the threshold voltage compensation phase, the digit lines DL and /DL may be offset based on threshold voltage differences between transistors of the sense amplifier, such as a threshold voltage difference between the transistors 312 and 313 of FIG. 3. During the threshold voltage compensation phase, the GUTA node may be coupled to the digit line /DL and the GUTB node may be coupled to digit line DL. Therefore, the GUTA and GUTB nodes may also be offset based on the threshold voltage differences between transistors of the sense amplifier.

At time T6, the AABLCP signal may transition to an inactive state, indicating an end to the threshold voltage compensation phase. In response to the AABLCP signal transitioning to the inactive state, the GUTA node may be decoupled from digit line /DL and the GUTB node may be decoupled from digit line DL. At time T7, the AABLEQ and AAGTEQ signals may transition to an active state to initiate the gut equalization phase. During the gut equalization phase, between times T7 and T8, the GUTA and GUTB nodes of the sense amplifier may be coupled together and to the VBLP voltage. The digit lines DL and /DL may remain offset based on the threshold voltage differences between transistors of the sense amplifier. At time T8, the AABLEQ and AAGTEQ signals may transition to an inactive state to end the gut equalization phase. Also at time T7, the wordline WL may be set to an active state, which may allow the wordline WL to begin charging to a voltage that enabled an access device to couple a target memory cell to one of the digit lines DL or /DL.

At time T9, the sense phase of the sense operation may commence. During the sense phase, the ISO signal may transition to an active state to couple the GUTA and GUTB nodes to the digit lines DL and /DL, respectively. At time T10, the sense amplifier may be activated (e.g., as indicated by the ACT and RNL signals transitioning to the respective VARY and VGND voltages from a common VBLP voltage). At time T11, the GUTA and GUTB nodes may begin transitioning to the respective VARY and VGND voltages based on a sensed data state of a coupled memory cell (e.g., coupled via the active wordline WL). Similarly, at time T11, the digit lines DL and /DL may begin transitioning to the respective VARY and VGND voltages based on a sensed data state of the coupled memory cell.

In some examples, if a read command READ is received via the command bus, a column select (CS) signal may be activated (e.g., in response to the READ command) after time T11, which may couple the digit lines DL and /DL to local input/output (I/O) lines to read out the data state of the memory cell.

Figure 7:
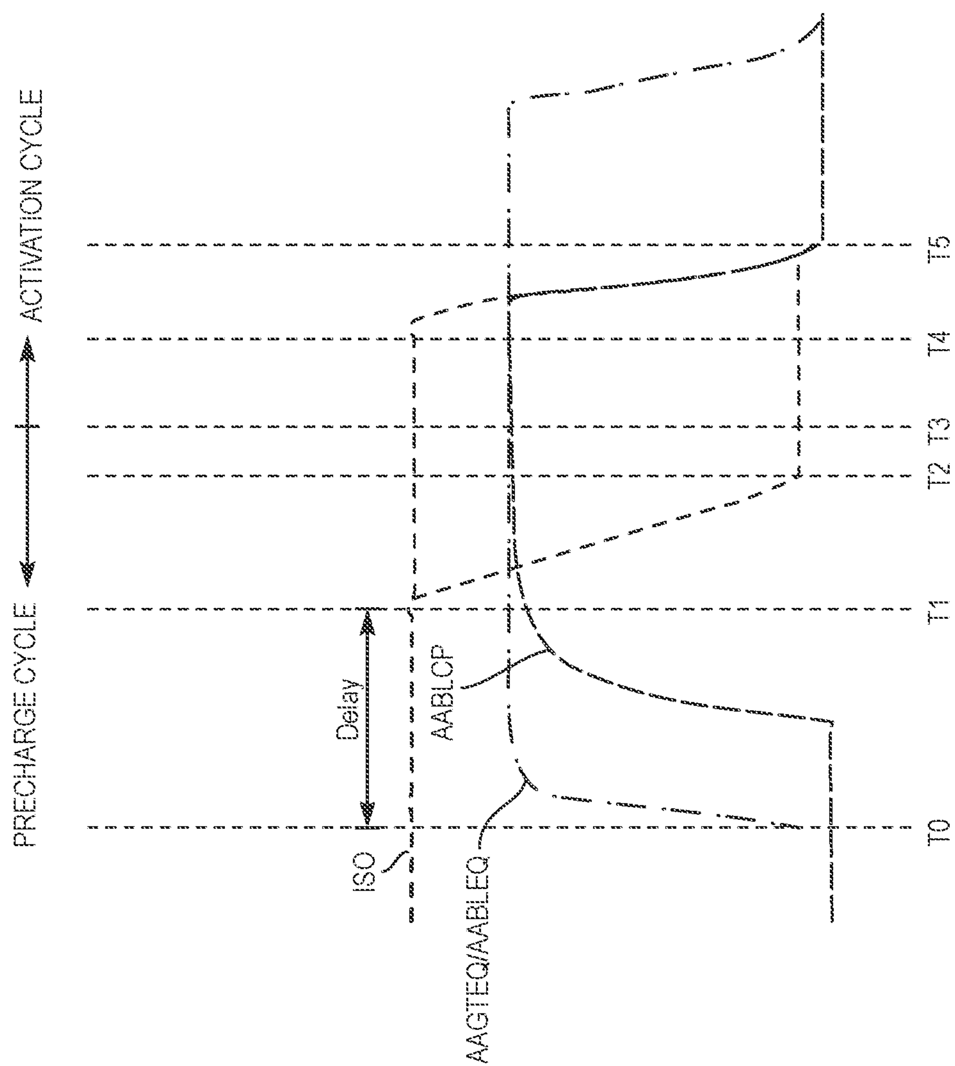
FIG. 7 is an illustration of an exemplary timing diagram depicting operation of a sense amplifier including transition of an isolation signal ISO to an inactive state during a precharge phase in accordance with embodiments of the disclosure.

FIG. 7 is an illustration of an exemplary timing diagram 700 600 depicting operation of a sense amplifier including transition of an isolation signal ISO to an inactive state during a precharge phase in accordance with embodiments of the disclosure. In some examples, the timing diagram 700 may depict operation of one of the sense amplifiers 150 of FIG. 1, the sense amplifier 210 of FIG. 2, the sense amplifier 300 of FIG. 3, or combinations thereof. The AABLCP, AABLEQ, AAGTEQ, and ISO signals may correspond to the AABLCP, AABLEQ, AAGTEQ, and ISO0/1 signals of FIG. 3.

A sense amplifier may be configured to operate in a precharge phase and an activation phase. The timing diagram 700 depicts part of precharge cycle associated with a precharge phase from at least time T0 to time T3, and part of an activation cycle associated with an activation phase from times T3 to at least time T5.

The precharge phase may have been initiated in response to a previously received precharge command PRE. The ISO signal may also remain in an active state from a preceding activation phase. At time T0, the AAGTEQ and AABLEQ signals may transition to an active state and the ACT signal and the RNL signal may transition to the VBLP voltage. In response to the AAGTEQ and AABLEQ signals transitioning to the active state, the VBLP voltage may be coupled to gut nodes of the sense amplifier, and in response to the ISO signal remaining in the active state, the VBLP voltage may also be coupled to the digit lines DL and /DL via the gut nodes. Thus, starting at time T0, the gut nodes and the digit lines DL and /DL may start transitioning to the VBLP voltage.

Sometime between T0 and T1, the AABLCP signal may transition to an active state. In response to the AABLCP transitioning to the active state, the gut nodes may be cross coupled with the digit lines /DL and DL in preparation for a threshold voltage compensation operation.

At time T3, the sense amplifier may transition to an activation phase in response to an activate command ACT. As shown in FIG. 7, two different example transitions of the ISO signal are depicted. A first example transition, shown at time T1, occurs during the precharge phase after a delay from time T0. A second example transition, shown at time T4, occurs during the activation phase in response to an activate command ACT.

In the first example transition, the ISO signal transition completes at time T2. The time at which the ISO signal is set to the inactive state may be based on delay from the time the AAGTEQ and AABLEQ signals set to the active state. Thus, the time T0 to time T1 may be a preconfigured delay. The delay may be based on an amount of time to allow the gut nodes, and digit lines DL and /DL to precharge to the VBLP voltage.

In the second example transition, the ISO signal transition completes at time T5. Because the threshold voltage compensation phase of a sense operation is initiated after the ISO signal is set to an inactive state, the threshold voltage compensation phase could not begin until some time after time T5 in the second example. Conversely, in the first example transition of the ISO signal during the precharge phase, the threshold voltage compensation phase could begin immediately after receipt of the activate command ACT, which would also move other subsequent phases of a sense operation an earlier time, and reduce tRCD. In this example, the tRCD may be reduced by up to the time difference between receipt of the activate command ACT at time T3 and completion of transition of the ISO signal at the T5. Thus, by setting the ISO signal to the inactive state during the precharge phase, the time to perform the sense operation during the activation phase may be reduced, which may directly reduce tRCD.

The timing diagrams 400, 600, and 700 are exemplary for illustrating operation of various described embodiments. Although the timing diagrams 400, 600, and 700 depict a particular arrangement of signal transitions of the included signals, one of skill in the art will appreciate that additional or different transitions may be included in different scenarios without departing from the scope of the disclosure. Further, the depiction of a magnitude of the signals represented in the timing diagrams 400, 600, and 700 are not intended to be to scale, and the representative timing is an illustrative example of a timing characteristics.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:

a memory comprising:

a sense amplifier configured to, during a precharge phase, couple a first gut node of the sense amplifier to a second gut node of the sense amplifier and to a precharge voltage while the first gut node and the second gut node are coupled to a first digit line and a second digit line, respectively, at a first time, and decouple the first gut node from the first digit line and decouple the second gut node from the second digit line at a second time that is after the first time, wherein the sense amplifier is further configured to transition to an activation phase in response to an activate command at a third time after the second time to perform a threshold voltage compensation operation and a sense operation.

2. The apparatus of claim 1, wherein the sense amplifier is further configured to, during the precharge phase, couple the first gut node with the second digit line between the first time and the second time.

3. The apparatus of claim 1, wherein the memory further comprises a memory cell coupled to the first digit line, wherein the sense amplifier is configured to perform the sense operation to sense a state of the memory cell.

4. The apparatus of claim 1, wherein the sense amplifier is further configured to transition to the precharge phase in response to a precharge command.

5. The apparatus of claim 1, wherein the first digit line is precharged to the precharge voltage between the first and second times.

6. The apparatus of claim 1, wherein the sense amplifier comprises a first transistor configured to selectively couple the first gut node to the first digit line and a second transistor configured to selectively couple the second gut node from the second digit line.

7. The apparatus of claim 1, wherein the memory further comprises a decoder circuit configured to, at the first time, cause the sense amplifier to couple the first gut node to the second gut node and to the precharge voltage.

8. The apparatus of claim 5, wherein the decoder circuit is further configured to, at the second time, cause the sense amplifier to decouple the first gut node from the first digit line and decouple the second gut node to the second digit line.

9. The apparatus of claim 1, wherein a wordline to an active state during the sense operation and is set to an inactive state during the precharge phase.

10. The apparatus of claim 1, wherein the sense amplifier is further configured to transition to a subsequent precharge phase after the sense operation in response to a precharge command.

11. An apparatus including:

a sense amplifier comprising a first gut node and a second gut node, wherein the sense amplifier is coupled to a first digit line and a second digit line; and a decoder circuit configured to transition from an activation phase to the precharge phase in response to a precharge command, wherein during the precharge phase, the decoder circuit is configured to set an isolation signal to cause the sense amplifier to decouple the first gut node from the first digit line and decouple the second gut node from the second digit line after the first gut node and the second gut node are precharged to the precharge voltage, wherein the decoder circuit is further configured to transition from the precharge phase to a subsequent activation phase in response to receipt of an activate command to cause the sense amplifier to perform a threshold voltage compensation operation based on a threshold voltage difference between at least two circuit components of the sense amplifier.

12. The apparatus of claim 11, wherein the sense amplifier is further configured to transition to a subsequent precharge phase after the threshold voltage compensation operation in response to a second precharge command.

13. The apparatus of claim 11, wherein the sense amplifier includes a first transistor configured to selectively couple the first gut node to the first digit line and a second transistor configured to selectively couple the second gut node to the second digit line.

14. The apparatus of claim 11, wherein the decoder circuit is further configured to control the first and second transistors to selectively couple the first gut node to the first digit line and the second gut node to the second digit line, respectively, during the activation phase.

15. The apparatus of claim 11, wherein the decoder circuit is further configured to deactivate a wordline during the precharge phase and to activate the wordline during at least part of the activation phase.

16. A method, comprising:

transitioning to a precharge phase in response to receipt of a precharge command at a memory;

during the precharge phase:

precharging first and second gut nodes of a sense amplifier of the memory to a precharge voltage starting at a first time; and decoupling the first gut node from a first digit line and decoupling the second gut node from a second digit line starting at a second time after the first time;

transitioning from the precharge phase to an activation phase in response to receipt of an activate command after the second time to perform a threshold voltage compensation operation based on a threshold voltage difference between at least two circuit components of the sense amplifier.

17. The method of claim 16, further comprising selecting a delay between the first and second times based on time to precharge the first and second gut nodes to the precharge voltage.

18. The method of claim 16, wherein the precharge voltage is less than an array voltage.

19. The method of claim 16, further comprising, during the precharge phase, cross-coupling the first gut node with the second digit line and the second gut node with the first digit line.

20. The method of claim 16, further comprising activating a wordline during or after the threshold voltage compensation operation to facilitate a sense operation associated with a memory cell coupled to the wordline and to one of the first or second digit lines.

* * * * *